(12) United States Patent
Nishino et al.

(10) Patent No.: US 7,222,040 B1
(45) Date of Patent: May 22, 2007

(54) METHODS AND APPARATUS FOR PRODUCING AN IC IDENTIFICATION NUMBER

(75) Inventors: Yoichi Nishino, Austin, TX (US); Hiroshi Yoshihara, Round Rock, TX (US)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 11/318,222

(22) Filed: Dec. 22, 2005

(51) Int. Cl.
*G06F 12/00* (2006.01)
*G01R 31/00* (2006.01)

(52) U.S. Cl. .............. 702/117; 709/229; 711/163; 711/217; 711/220

(58) Field of Classification Search .............. None
See application file for complete search history.

(56) References Cited

U.S. PATENT DOCUMENTS

| 5,893,910 A | * | 4/1999 | Martineau et al. ............ 707/10 |
| 2002/0168815 A1 | * | 11/2002 | Hartmann ................... 438/201 |
| 2004/0053429 A1 | * | 3/2004 | Muranaka .................... 438/17 |
| 2006/0044917 A1 | * | 3/2006 | Kawakami et al. ......... 365/226 |
| 2006/0050580 A1 | * | 3/2006 | Yamaguchi et al. ........ 365/201 |

\* cited by examiner

*Primary Examiner*—Marc S. Hoff
*Assistant Examiner*—Manuel L. Barbee
(74) *Attorney, Agent, or Firm*—Kaplan Gilman Gibson & Dernier LLP; Matthew B. Dernier

(57) ABSTRACT

Methods and apparatus provide for: testing a static random access memory (SRAM) to obtain performance data on the SRAM; and using the performance data as at least a basis of a identification number.

17 Claims, 8 Drawing Sheets

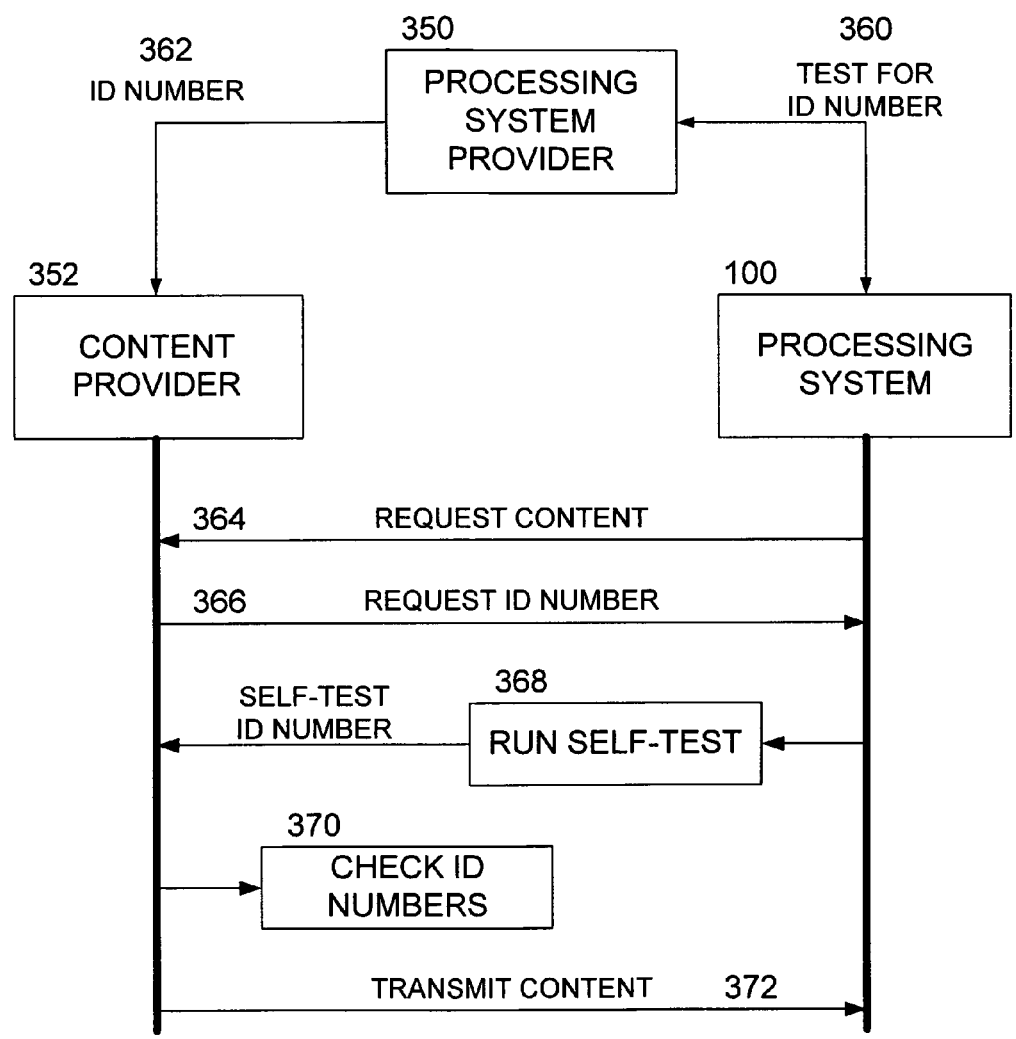

US 7,222,040 B1

METHODS AND APPARATUS FOR PRODUCING AN IC IDENTIFICATION NUMBER

BACKGROUND

The present invention relates to methods and apparatus for generating identification numbers.

The use of identification numbers, for example, in processing systems is becoming common and essential, particularly where secure communications functionality is desired. For example, a processing system may employ an identification number in order to permit a processor to create secure modes of communication or to provide authentication and/or verification for receiving content. For example, verification techniques are often used to permit a processor to download content (software programs, data, OS upgrades, etc.) over a network, such as the internet from an administrative entity or content provider. A verified identification number from the processor may provide at least part of the necessary information to prove the authenticity of the user and the processor.

The problems associated with prior art techniques for generating an identification number is that they require an undesirable amount of additional circuitry in order to achieve the desired functionality, which circuitry may be compromised. Thus, there is a need in the art for new ways of achieving identification number generation, preferably that makes use of existing circuitry in the system in which it is employed.

SUMMARY OF THE INVENTION

One or more embodiments of the present invention relates to a technique for generating an identification number in a processor system.

In accordance with one or more embodiments of the present invention methods and apparatus provide for: testing a static random access memory (SRAM) to obtain performance data on the SRAM; and using the performance data as at least a basis of a identification number. Preferably, the identification number is substantially unique and substantially repeatable.

In accordance with one or more embodiments, the testing action may include: (i) identifying at least some memory cells of the SRAM that have an access speed margin at least one of lower than a predetermined threshold and higher than a predetermined threshold as the performance data or identifying at least some memory cells of the SRAM that have an access time at least one of greater than a predetermined threshold and lower than a predetermined threshold as the performance data; and (ii) using addresses of at least some of the memory cells of the SRAM at least as a basis of the identification number. Alternatively or in addition, the addresses of at least some of the memory cells of the SRAM may be further processed to form the identification number.

In accordance with one or more further embodiments, the testing action may include: setting a supply voltage to the SRAM below its normal operating voltage; identifying at least some memory cells of the SRAM that fail a read and/or write test as the performance data; and using addresses of at least some of the memory cells of the SRAM at least as a basis of the identification number. The testing action may further include: repeating the testing steps at least one lower or higher level of the supply voltage to obtain further performance data; and using addresses of at least some of further identified memory cells of the SRAM as at least part of the identification number.

In accordance with one or more further embodiments, the testing action may include: (i) identifying at least some memory cells of the SRAM that have an access speed margin at least one of lower than a predetermined threshold and higher than a predetermined threshold as the performance data, or identifying at least some memory cells of the SRAM that have an access time at least one of higher than a predetermined threshold and lower than a predetermined threshold as the performance data, and (ii) setting a supply voltage to the SRAM to its normal operating voltage and identifying at least some memory cells of the SRAM that fail a read and/or write test as the performance data. The methods and apparatus may further provide for: repairing at least some of the memory cells resulting in failure of the testing step; and using repair addresses of at least some of the repaired memory cells of the SRAM at least as a basis of the identification number.

In accordance with one or more further embodiments, the testing action may include: powering up the SRAM; interrogating a relatively large number of memory cells of the SRAM; using contents of at least some of the memory cells as at least the basis of the identification number. The identification number may be authentication and/or verified by: storing the identification number with an administrative entity; re-testing for a subsequent identification number using the testing step; and transmitting the subsequent identification number to the administrative entity for verification. The verification step may include: producing a sum of products on at least some digits of the identification number and the subsequent identification number; and verifying the subsequent identification number when the sum of products exceeds a predetermined threshold.

In accordance with one or more further embodiments, the methods and apparatus may further provide for: storing the identification number with an administrative entity; re-testing for a subsequent identification number using the testing step; and transmitting the subsequent identification number to the administrative entity for verification.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIG. 9 is a flow diagram illustrating process steps that may be carried out in using the identification number generator of FIG. 1 and/or other embodiments herein in accordance with one or more further aspects of the present invention.

DETAILED DESCRIPTION OF THE PRESENT INVENTION

With reference to the drawings, wherein like numerals indicate like elements, there is shown in the figures various systems that may be operable and/or adapted for carrying out one or more features of the present invention. For the purposes of brevity and clarity, the block diagrams of the figures will be referred to and described herein as illustrating one or more apparatus, it being understood, however, that the description may readily be applied to various aspects of one of more methods with equal force.

Figure 1:
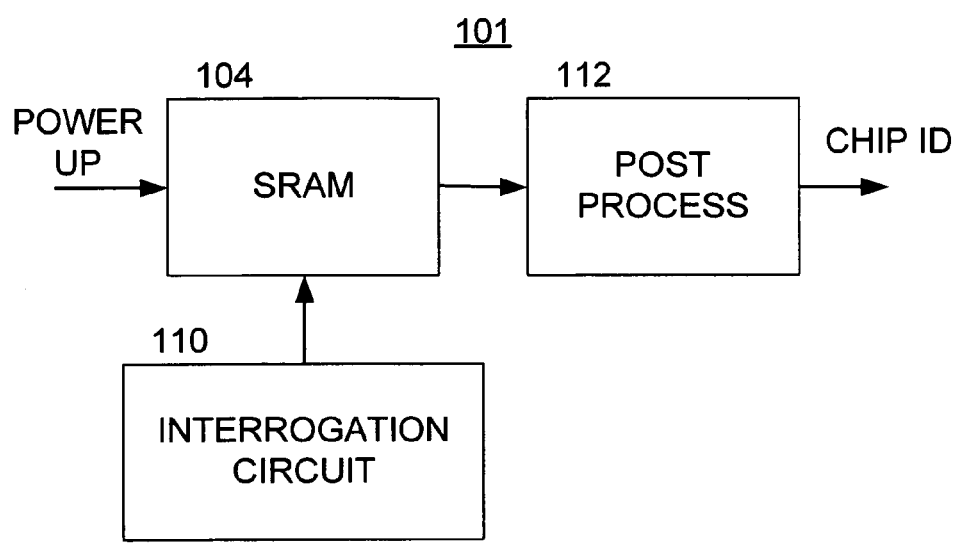
FIG. 1 is a block diagram illustrating the structure of an identification number generator in accordance with one or more aspects of the present invention.

FIG. 1 is a block diagram illustrating the structure of an identification number generator 101 in accordance with one or more aspects of the present invention. The identification number generator 101 includes a static random access memory (SRAM) 104, an interrogation circuit 110, and optionally a post process circuit 112. The SRAM 104 may be of any significant size, for example, 512 KB, 1 MB, etc. The SRAM 104 is preferably implemented utilizing a plurality of flip-flop circuits, each flip-flop circuit representing a storage location (or portion of a storage location).

Figure 2:
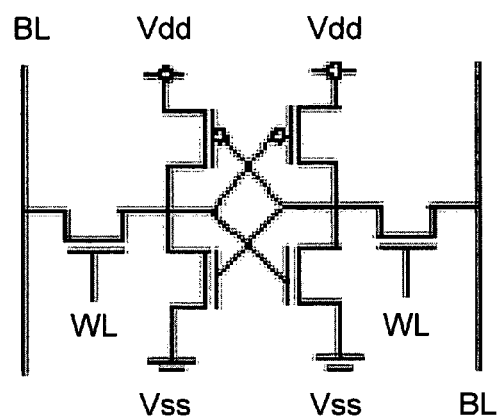
FIG. 2 is a schematic diagram of a memory cell of the SRAM of FIG. 1.

FIG. 2 is a schematic diagram of a circuit that is suitable for implementing the flip-flop circuits of a memory cell of the SRAM 104 of FIG. 1. The circuit includes a plurality of FETs coupled between a source of operational power, represented by voltage potential Vdd and voltage potential Vss (which is typically ground potential). Respective bit lines (BLs) and word lines (WLs) bias the memory cell to store and read information in/from the circuit. So long as power is applied to the SRAM 104, each flip-flop circuit is capable of storing a logic high or a logic low, depending on how the flip-flop was programmed.

The interrogation circuit is preferably operable to obtain performance data and/or the contents of at least some of the storage cells within the SRAM 104.

Among the non-ideal performance characteristics of the SRAM 104 is its asymmetry. Ideally, the flip-flop circuits are symmetrically designed, such that each is theoretically just as likely to power up in a logic high state as in a logic low state. In practice, however, some of the memory cells are more likely to come up in one state than the other. For example, relatively small threshold voltages of the transistors and/or dimension unevenness contribute to a tendency for a particular memory cell to power up in one state versus the other.

Figure 3:
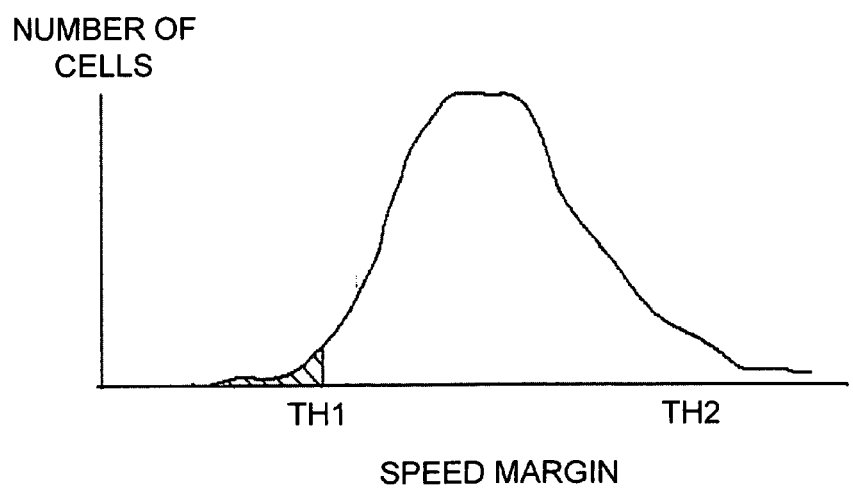
FIG. 3 is a graphical illustration of the distribution of low performance memory cells of the SRAM of FIG. 1.

Reference is now made to FIG. 3, which is a graphical illustration of additional non-ideal performance characteristics of the memory cells of the SRAM 104. The graph shows the speed margin of the memory cells plotted on the Abscissa and the number of cells plotted on the ordinate axis. The speed margin is a measurement indicative of the access time of a particular memory cell. For example, a relatively slow access time may be approximately 30 ps, which also may represent a minimum acceptable access time for any particular memory cell of the SRAM 104. Under this example, therefore, the speed margin of a memory cell having a 30 ps access time is 0. A cell exhibiting an access time of 20 ps exhibits a speed margin of 10 ps. A memory cell exhibiting an access time of 10 ps has a speed margin of 20 ps, etc.

A predetermined threshold TH1 may be established, which defines so-called "low speed margin" memory cells. For example, the threshold TH1 may be set at 5 ps, thereby defining low speed margin cells as being any memory cell exhibiting an access time of 25 ps or greater. Similarly, so-called high speed margin cells may be defined by a second threshold TH2, which indicates access times for certain memory cells of the SRAM 104 that are extremely fast. Notably, the distribution of the speed performance parameter of the SRAM 104 as illustrated in FIG. 3 is Gaussian. Thus, there are a relatively low number of low speed margin cells, a relatively high number of moderately high speed margin cells and a relatively low number of very high speed margin cells (above TH2).

Figure 4:
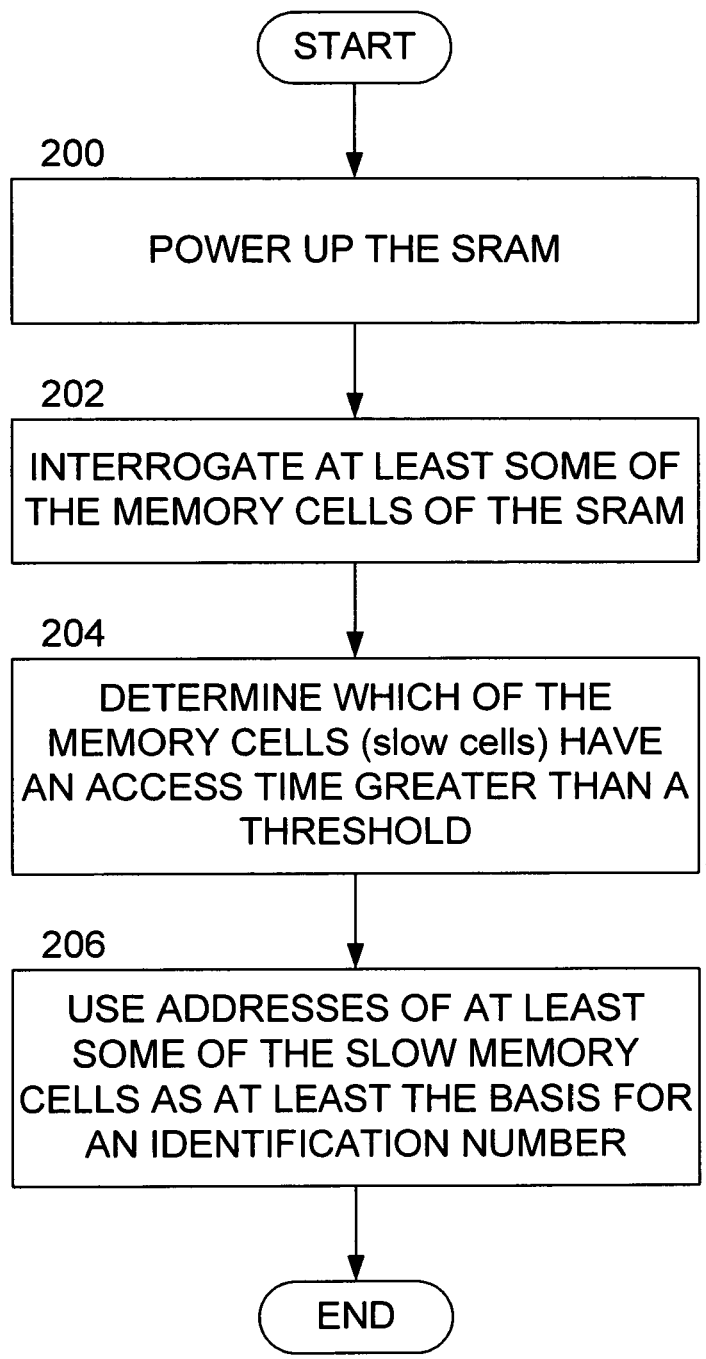
FIG. 4 is a flow diagram illustrating process steps that may be carried out by the identification number generator of FIG. 1 and/or other embodiments herein in accordance with one or more aspects of the present invention.

Although the invention is not limited by any particular theory of operation, it has been discovered that the performance data, such as that illustrated in FIG. 3, may be utilized in generating an identification number for a particular piece of equipment in which the SRAM 104 is disposed. In this regard, reference is now made to FIG. 4, which is a flow diagram illustrating process steps that may be carried out by the identification number generator 101 of FIG. 1 (and/or other embodiments herein).

At action 200, the SRAM 104 is powered up such that it is in condition for storage and/or retrieval of data. The interrogation circuit 110 is preferably operable to obtain performance data concerning the SRAM 104. This performance data is preferably obtained by way of interrogating at least some of the memory cells of the SRAM 104 (action 202). In one of the broader aspects of the present invention, the performance data obtained by the interrogation 110 is preferably used at least as a basis of an identification number. Preferably, the identification number is at least one of substantially unique and substantially repeatable, at least to the extent that the identification number provides sufficient uniqueness and repeatability as to be tested in the future and utilized for authentication and/or verification purposes.

In accordance with one or more embodiments of the present invention, the interrogation circuit 110 is preferably operable to identify at least some memory cells of the SRAM 104 that exhibit relatively low probability access times. For example, the interrogation circuit 110 may be operable to identify at least some memory cells of the SRAM 104 that have an access speed margin at or below the threshold TH1. In other words, the interrogation circuit 110 may be operable to identify at least some memory cells of the SRAM 104 that have an access time greater than some predetermined threshold (action 204). The identified speed margin (or access time) is thus performance data or performance criteria that may be utilized at least as a basis of an identification number. By way of example, addresses of at least some of the memory cells of the SRAM 104 identified by the interrogation circuit 110 may be used at least as a basis of the identification number (action 206). The addresses may be arranged in series to produce a string of logic high and logic low levels indicating a digital identification number.

As discussed above, a relatively low number of memory cells of the SRAM 104 exhibit speed margins high enough to meet or exceed the second threshold TH2. Thus, the interrogation circuit 110 may be operable to identify at least some memory cells of the SRAM 104 that have an access speed margin higher than the threshold TH2. This functionality may be employed as an alternative or an addition to action 204 discussed above. Further, the addresses of at least some of the memory cells of the SRAM 104 so identified may be utilized at least as a basis for the identification number. Again, this may be in addition to or as an alternative to action 206 discussed above. In a further embodiment, addresses of at least some memory cells of the SRAM 104 exhibiting relatively slow access times and addresses of at least some memory cells of the SRAM 104 exhibiting relatively high access times may be combined to form at least a portion of the identification number.

In accordance with one or more further aspects of the present invention, the post process circuit 112 may provide further processing on the identification number. The post process circuit 112 is preferably operable to manipulate the results of the testing and identification steps to produce the identification number. This may entail applying an algorithm that reduces the number of bits in the identification number as compared with the number of bits obtained from the testing/identifying steps. By way of example, the post processing circuit 112 may be operable to carry out any of the known or hereinafter developed hash algorithms, such as the SHA-1 algorithm. Alternatively, or in addition, the post processing circuit 112 may be operable to perform a compression algorithm such as the shift and sum algorithm.

In connection with the foregoing embodiments and any embodiments hereinafter described, the interrogation circuit 110 may include a built-in test circuit operable to exercise certain performance criteria of the SRAM 104 to obtain the performance data thereof. In particular, the built-in test circuit may include an address generator, a controller, and/or a pattern generator (not shown). The controller is preferably operable to interface with the address generator and the pattern generator in order to interrogate the one or more storage locations of the SRAM 104. In one or more embodiments, the pattern generator is operable to change the predetermined storage locations to be interrogated from time to time. In one or more alternative embodiments, the interrogation circuit 110 may be implemented using a processor (or central processing unit CPU) and a storage circuit (not shown). In a preferred embodiment, the storage circuit is a read only memory (ROM) and the processor is preferably operable to execute program code that causes the processor to exercise at least some storage locations of the SRAM 104 to obtain the performance data. The storage circuit is preferably coupled to the processor in such a way as to store the program code for access by the processor. In operation, the processor is preferably operable to interrogate the SRAM 104 to obtain the performance data in accordance with the program code stored in the storage circuit. In an alternative embodiment, the processor is also preferably operable to carry out post processing on the results of the testing/identification steps to produce the identification number.

Figure 5:
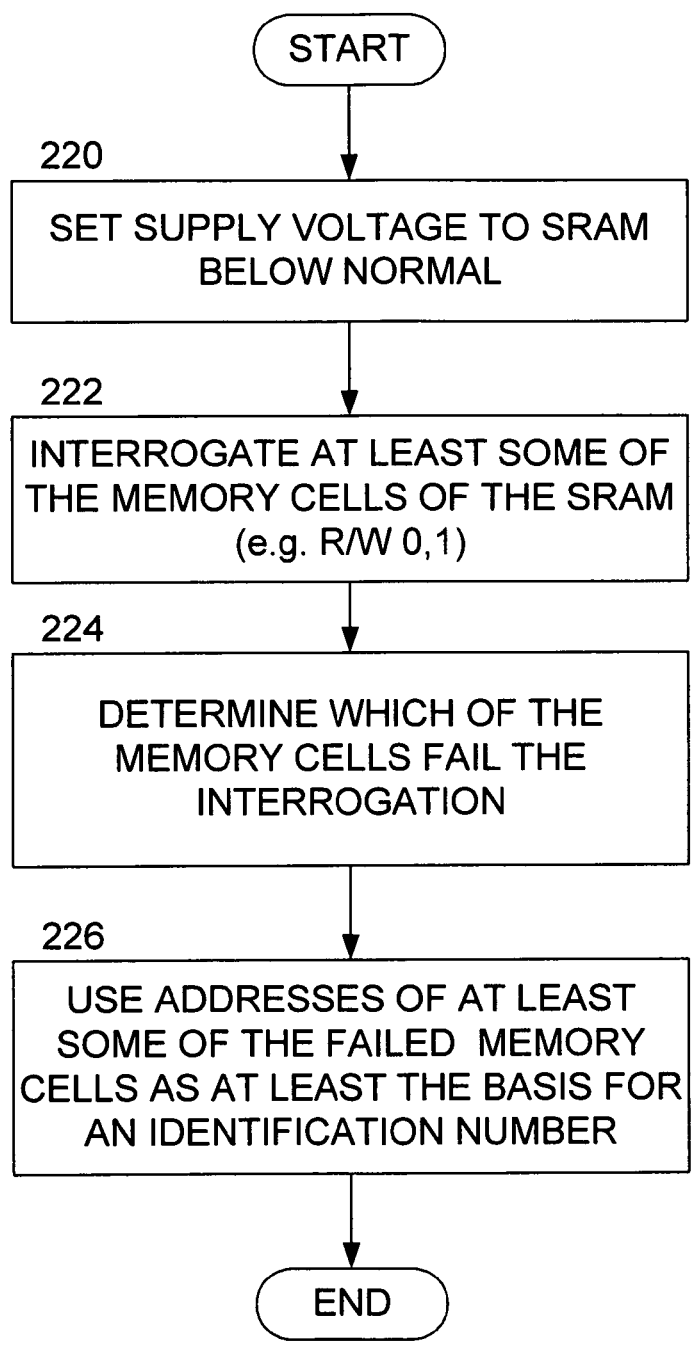
FIG. 5 is a flow diagram illustrating alternative process steps that may be carried out by the identification number generator of FIG. 1 and/or other embodiments herein in accordance with one or more aspects of the present invention.

Reference is now made to FIG. 5, which is a flow diagram illustrating an alternative or additional process that may be carried out by the identification number generator 101 of FIG. 1 (and/or other embodiments herein). Another performance criterion of the SRAM 104 is the extent of memory cells that fail a read and/or a write operation altogether. Indeed, at least some memory cells of a typical SRAM 104 are incapable of storing a logic 0 or logic 1 and/or retrieving a stored logic 0 or logic 1 when called upon to do so. Generally, the number of memory cells of the SRAM 104 that fail a read/write interrogation test increases as the supply voltage to the SRAM 104 decreases. In other words, as the potential difference between Vdd and Vss (FIG. 2) decreases, the number of memory cells of the SRAM 104 that fail a read/write test increases.

In accordance with one or more embodiments of the present invention, the interrogation circuit 110 is preferably operable to set the supply voltage (operating voltage) of the SRAM 104 to a level below normal (action 220). For example, if the normal supply voltage level to the SRAM 104 is 1.0 volts, the interrogation circuit 110 is preferably operable to set the supply voltage to, for example, 0.9 volts, 0.8 volts, 0.7 volts, etc. or any voltage therebetween. While not intended to limit the invention, it is generally recognized that the state of the art SRAM technology cannot operate below about 0.5 volts. Irrespective of the particular level of the operating voltage of the SRAM 104, the interrogation circuit 110 then preferably interrogates at least some of the memory cells of the SRAM 104 by initiating a read and/or write operation of at least one of a logic 0 and a logic 1 (action 222). At Action 224, the interrogation circuit 110 is preferably operable to determine which of the memory cells fail the interrogation at action 222, such determination being indicative of the performance data of the SRAM 104. At Action 226, addresses of at least some of the failed memory cells are utilized at least as a basis of the identification number. As discussed in other embodiments herein, the addresses may be arranged in series to produce a digital string of logic high and logic low values to produce the identification number. Further, the post process circuit 112 may be employed in order to further refine the identification number, such as by hash algorithms, compression algorithms, etc.

In accordance with one or more embodiments of the present invention, the interrogation circuit 110 may repeat the setting of the supply voltage of the SRAM 104 to successively lower and/or higher voltages and repeat the interrogation to generate further addresses of failed memory cells. Such further addresses may be utilized to augment the previously obtained addresses of failed memory cells (at different supply voltage levels) in producing the identification number.

Figure 6:
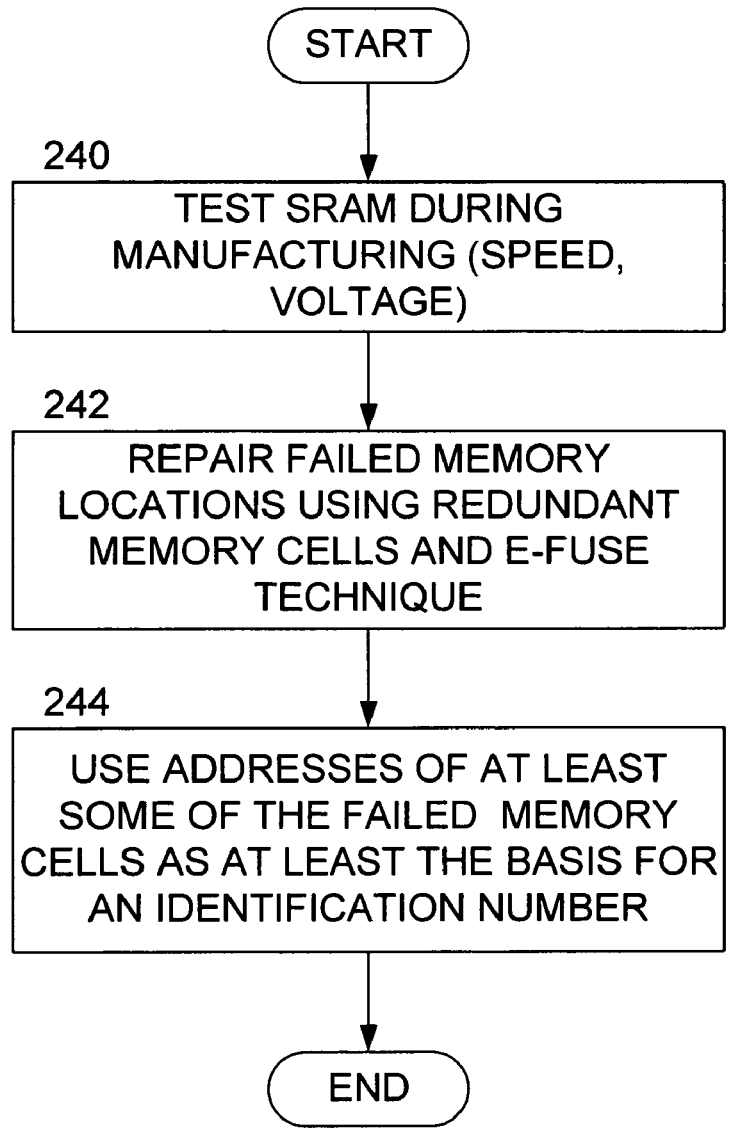
FIG. 6 is a flow diagram illustrating further alternative process steps that may be carried out by the identification number generator of FIG. 1 and/or other embodiments herein in accordance with one or more aspects of the present invention.

Reference is now made to FIG. 6, which is a flow diagram illustrating further alternative or additional process steps that may be carried out by the identification number generator 101 of FIG. 1 (and/or other embodiments therein). As discussed above, the SRAM 104 may exhibit non-ideal performance characteristics involving, for example, low access speed margins, inability to store and/or retrieve data (e.g., due to low operating voltages), etc. A conventional manufacturing technique dictates that such poor performing memory cells (action 240) may be replaced by substituting them in the memory array utilizing repair memory cells. Repair memory cells are redundant memory cells that are invoked only when needed to replace failed memory cells (action 242). The repair memory cells are typically invoked by activating electronic fuses (e-fuses), which identify one or both of a failed memory cell and the repair memory cell that replaces the failed memory cell.

In accordance with one or more embodiments of the present invention, addresses of at least some of the failed memory cells and/or repair memory cells may be utilized at least as a basis of the identification number (action 244). As in prior embodiments, such addresses may be arranged in series to produce a string of logic high and logic low levels. The string of levels may be further processed by the post process circuit 112, such as by applying a hash algorithm, a compression algorithm, etc.

It is noted that no matter which technique discussed above is employed to produce the identification number, such as the memory access time approach (FIG. 4), the read/write failure approach (FIG. 5), or the repair address approach (FIG. 6), the identification number is preferably repeatable such that, when called upon, the device employing the identification number generator 101 may reproduce the identification number for authentication and/or verification. For example, the identification number may be initially produced during the manufacturing process of the device in which the identification number generator 101 is employed. This initial identification number may be stored in a secure location, such as at an administrating entity. Thereafter, such as when the device is purchased by a user, the user (or the device directly) may be called upon to provide the identification number for verification before further desirable processing action may take place. When called upon to reproduce the identification number, the identification number generator 101 may re-execute the process steps illustrated, for example, in FIGS. 4, 5 and/or 6 to produce a subsequent identification number useful for authentication and/or verification with the original identification number held in the secure location. Verification would entail comparing the original and subsequent identification numbers to determine whether a match exists. The match may be an exact match or may be a sufficient level of correspondence as to ensure that the identification numbers indicate an authorized or verified device. Additional details concerning one example of how authentication and/or verification of the identification number may be used in a processing system will be provided later in this description.

The quality of the identification number produced in accordance with the approach of the above techniques may be evaluated as follows. Assume that 30 out of 100 addresses of the identification number match. The probability P1 that two identification numbers share a particular address of cell n may be expressed as follows:

$$\frac{_{100}C_n}{_{1000000}C_n} \approx 10^{-120}$$

where Cn is the combination associated with, for example, 100 addresses of an identification number taken from a possible 1000000 memory cells. Thus, the probability of two identification numbers sharing more than n addresses is expressed as follows:

$$\sum_{n=30} \frac{_{100}C_n}{_{1000000}C_n} \approx 10^{-120},$$

a very low probability indeed. Thus, the identification numbers comtemplated by the various embodiments herein exhibit satisfactory quality in terms of their uniqueness and repeatability despite being theoretically imperfect.

Figure 7:
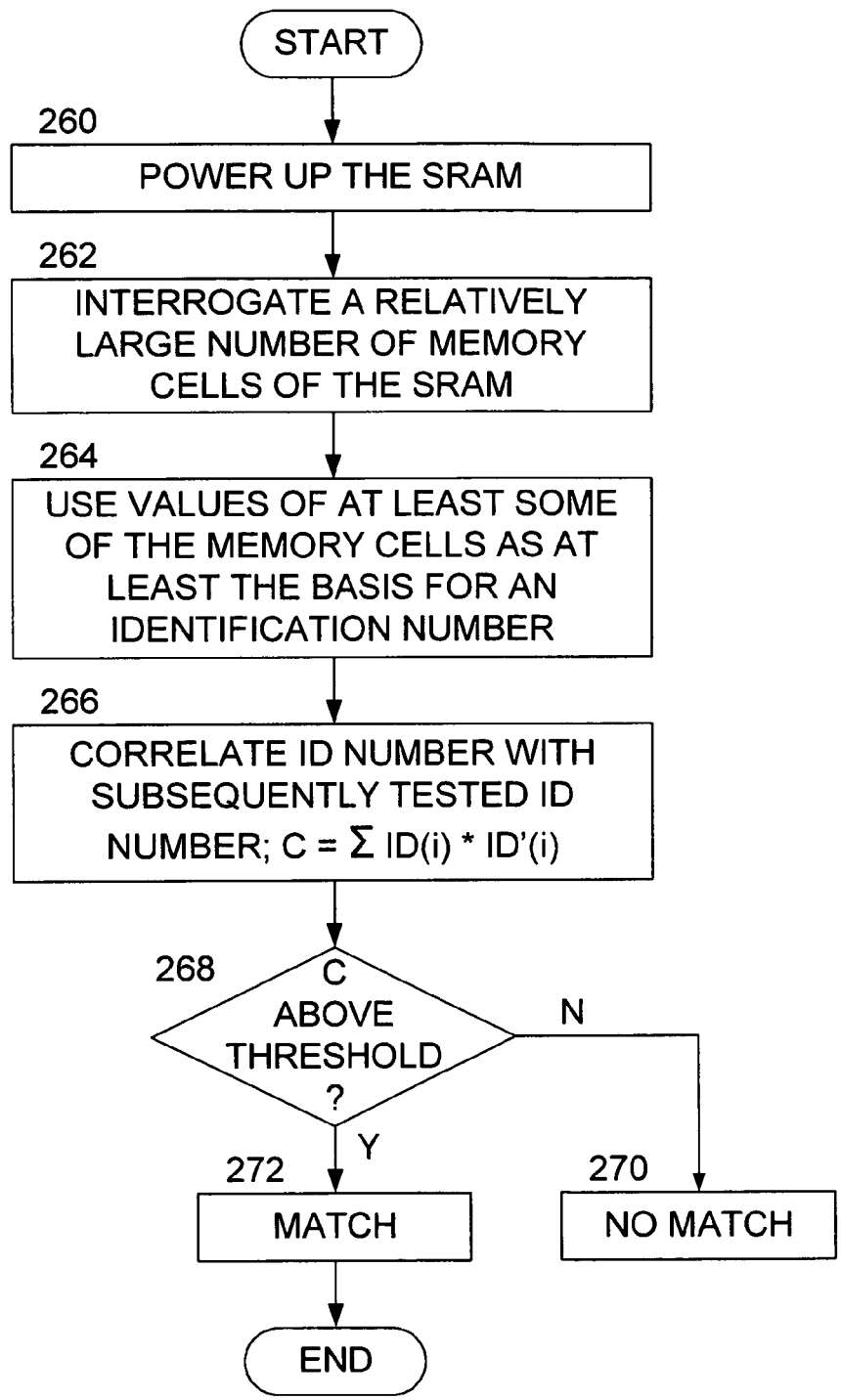
FIG. 7 is a flow diagram illustrating still further alternative process steps that may be carried out by the identification number generator of FIG. 1 and/or other embodiments herein in accordance with one or more aspects of the present invention.

Reference is now made to FIG. 7, which illustrates a further alternative or additional process that may be carried out by the identification number generator 101 of FIG. 1 (and/or other embodiments herein). As discussed above, another non-ideal performance characteristic of the SRAM 104 is that the flip-flop circuits (FIG. 2) of each memory cell of the SRAM 104 is not perfectly symmetrical and, therefore, is more likely to latch into a logic high or a logic low state when the SRAM 104 is powered up. It has been discovered that this performance criterion of the SRAM 104 may be exploited in producing an identification number. At action 260, the SRAM 104 is powered up. At action 262, the interrogation circuit 110 is preferably operable to interrogate a relatively large number of the memory cells of the SRAM 104. At least some of the values of the interrogated memory cells may be utilized at least as a basis for the identification number (action 264). For example, the values may be arranged in a series to produce a digital string of logic high and logic low values in order to produce the identification number.

As discussed above, the post process circuit 112 may be utilized to further process the string of logic high and logic low levels to produce the identification number. For example, the post process circuit 112 may employ a hash algorithm, a compression algorithm, etc. in order to produce the final identification number.

As discussed above, an initial identification number is preferably produced during the manufacturing process and stored in a secure location for later authentication or verification with a subsequently produced identification number. In this regard, the subsequently produced identification number utilizing actions 260, 262 and 264 may be compared with the initial identification number in an authentication process. For example, at action 266, the original identification number and the subsequent identification number may be correlated utilizing the following formula:

$$C = \Sigma i\ ID(i) \times ID'(i),$$

where ID(i) is the initial identification number and ID'(i) is the subsequent identification number.

At action 268, a determination is preferably made as to whether the result C is above or below a threshold. If the result is below the threshold, the process preferably advances to action 270, where no match is obtained and the verification process fails. Under these circumstances, it is contemplated that no further actions are taken that would require an authentic subsequent identification number for proceeding. If the result C is above the threshold, indicating a high correlation between the original and subsequent identification numbers, the process is preferably advances to action 272, where a match is obtained. Under these circumstances, it is contemplated that further processing steps may be carried out as the verification process has been successful.

In this regard, it is noted that the value of the threshold is of interest in carrying out the verification process. The relationship of the threshold to the usefulness of the identification number may be illustrated by the following example. Assuming that: (i) the number of memory cells in the SRAM 104 is 1,000,000, (ii) each memory cells in the SRAM 104 is 1% more likely to latch in one direction than the other direction, and (iii) the threshold is set to about 10,000, then it may be shown that the identification number produced in accordance with the details above provides reliable identification. Indeed, if the correlation function discussed above were used to correlate two random bit patterns, the standard deviation of the result would follow the following formula:

$$\sigma = \sqrt{n},$$

where σ is the standard deviation and n is the number of bits in each of the numbers to be correlated. In keeping with the example above, the standard deviation would thus be 1,000. Using a threshold of 10,000, therefore, is 10 times larger than the standard deviation expected in correlating two random bit patterns. This shows that the identification number is repeatable at least to the extent it may be tested to a reliable extent. An increase in reliability, therefore, may be obtained by increasing the threshold required to match the identification numbers. An alternative approach would be to repeat the production of the subsequent identification number and correlate a number of times to see whether a match is obtained more often than not.

Figure 8:
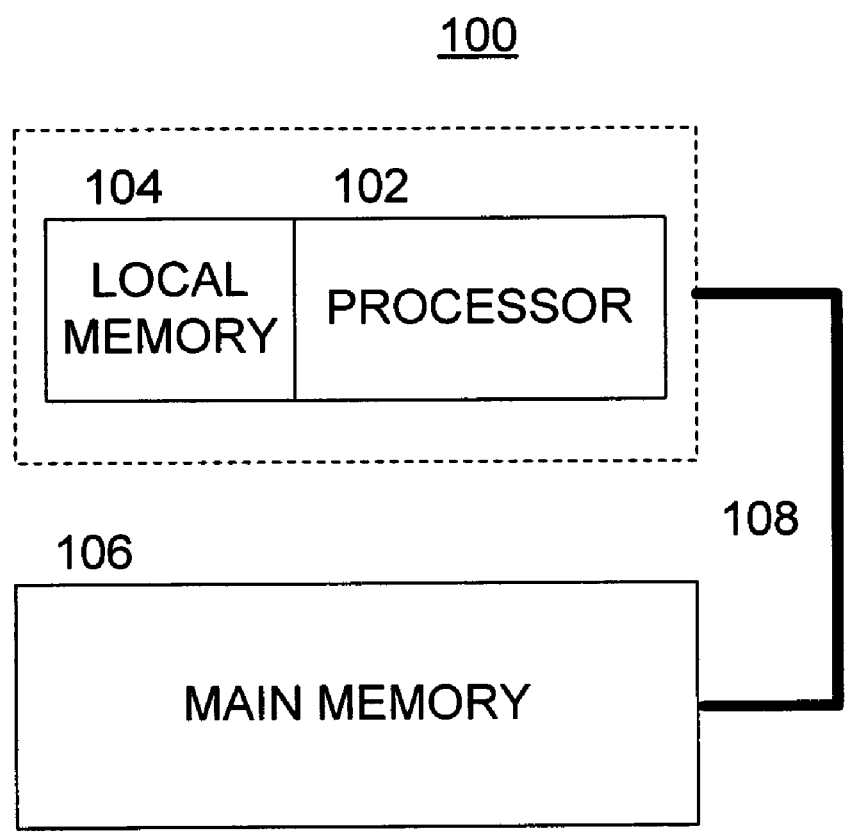
FIG. 8 is a diagram illustrating the structure of a processing system that may be adapted in accordance with one or more aspects of the present invention.

Reference is now made to FIG. 8, which illustrates a system or apparatus 100 that is adapted using the identification number generator 101 discussed above. The apparatus 100 preferably includes a processor 102, a local memory 104, a main memory 106 (e.g., a DRAM), and a bus 108. The processor 102 may be implemented utilizing any of the known technologies that are capable of requesting data from the system memory 106, and manipulating the data to achieve a desirable result. For example, the processor 102 may be implemented using any of the known microprocessors that are capable of executing software and/or firmware, including standard microprocessors, distributed microprocessors, etc. By way of example, the processor 102 may be a graphics processor that is capable of requesting and manipulating data, such as pixel data, including gray scale information, color information, texture data, polygonal information, video frame information, etc.

The processor 102 is preferably implemented using a processing pipeline, in which logic instructions are processed in a pipelined fashion. Although the pipeline may be divided into any number of stages at which instructions are processed, the pipeline generally comprises fetching one or more instructions, decoding the instructions, checking for dependencies among the instructions, issuing the instructions, and executing the instructions. In this regard, the processor 102 may include an instruction buffer, instruction decode circuitry, dependency check circuitry, instruction issue circuitry, and execution stages.

The system memory 106 is preferably a dynamic random access memory (DRAM) coupled to the processors 102 through a high bandwidth memory connection (not shown). Although the system memory 106 is preferably a DRAM, the memory 106 may be implemented using other means, e.g., a static random access memory (SRAM), a magnetic random access memory (MRAM), an optical memory, a holographic memory, etc.

The local memory 104 is located in proximity to the processor 102 such that the processor may execute program code and otherwise manipulate data within the local memory 104 as opposed to the system memory 106. The local memory 104 is preferably not a traditional hardware cache memory in that there are preferably no on chip or off chip hardware cache circuits, cache registers, cache memory controllers, etc. to implement a hardware cache memory function. As on-chip space may be limited, the size of the local memory 104 may be much smaller than the system memory 106.

Preferably, the local memory 104 is implemented using a static random access memory (SRAM). The system 100 preferably includes additional components (such as an interrogation circuit 110 and post process circuit 112) in order to implement an identification number generator 101 as discussed herein above. It is contemplated that any of the implementations of the identification number generator 101 discussed above or the equivalents thereof may be employed in the system 100.

In one or more embodiments, the processor 102 and the local memory 104 may be disposed on a common semiconductor substrate. In one or more further embodiments, the shared memory 106 may also be disposed on the common semiconductor substrate or it may be separately disposed.

In one or more further embodiments of the invention, the identification number generator 101 may be implemented in a multi-processor system. It is contemplated that one or more of the processors of the multi-processor system may include an identification number generator 101 to produce identification number(s). Thus, for example, the processors of the multi-processor system may achieve independent security features by way of separate identification number generators 101.

Reference is now made to FIG. 9, which is a partial block diagram and partial flow diagram illustrating process steps that may be carried out using the identification number generator of FIG. 1 (and/or other embodiments herein) within the processing system 100 of FIG. 8 (or other embodiments herein). The identification number generator 101 is preferably utilized during the manufacturing process to produce an initial identification number (action 360). This is preferably carried out by the processing system provider 350. The initial identification number is preferably transferred to administrative entity (action 362), such as a content provider 352. Examples of content providers, are software program providers, operating system providers, etc. that may require identification number verification with a particular processing system 100 before further actions, such as transfer of content to the processing system 100 may take place.

For example, at action 364, the processing system 100 may request content from the content provider 352. In response, the content provider 352 may request a subsequent identification number from the processing system 100 (action 366). In response, the processing system 100, and more specifically, the identification number generator 101 thereof, may run a self-test (action 368) in accordance with any of the aforementioned embodiments for producing an identification number. The subsequent identification number is then transmitted to the content provider 352. The content provider 352 in turn attempts to verify the identification number by comparing same with the initial identification number provided by the processing system provider 350. This comparison may be in accordance with any of the aforementioned comparison techniques discussed above or developed hereinafter. Assuming that the identification numbers match, at least to a sufficient extent, the content provider 352 preferably transmits the content to the processing system 100 (action 372).

Thus, the identification number generator 101 may be utilized to produce an initial identification number that is substantially unique and substantially repeatable for a particular processing system 100. Thereafter, the identification number generator 101 may be utilized to produce a subsequent identification number for use in an authentication and/or verification process.

In accordance with at least one further aspect of the present invention, the methods and apparatus described above may be achieved utilizing suitable hardware, such as that illustrated in the figures. Such hardware may be implemented utilizing any of the known technologies, such as standard digital circuitry, any of the known processors that are operable to execute software and/or firmware programs, one or more programmable digital devices or systems, such as programmable read only memories (PROMs), programmable array logic devices (PALs), etc. Furthermore, although the apparatus illustrated in the figures are shown as being partitioned into certain functional blocks, such blocks may be implemented by way of separate circuitry and/or combined into one or more functional units. Still further, the various aspects of the invention may be implemented by way of software and/or firmware program(s) that may be stored on suitable storage medium or media (such as floppy disk(s), memory chip(s), etc.) for transportability and/or distribution.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method comprising:
    testing a static random access memory (SRAM) to: (i) identify at least some memory cells of the SRAM that have an access speed margin at least one of lower than a predetermined threshold and higher than a predetermined threshold; or (ii) identify at least some memory cells of the SRAM that have an access time at least one of greater than a predetermined threshold and lower than a predetermined threshold;
    using addresses of at least some of the identified memory cells of the SRAM as at least a basis of a identification number; and
    storing the identification number in memory for subsequent retrieval.

2. The method of claim 1, wherein the identification number is substantially unique and substantially repeatable.

3. The method of claim 1, further comprising processing the addresses of at least some of the memory cells of the SRAM to form the identification number.

4. The method of claim 1, further comprising:
    storing the identification number with an administrative entity;
    re-testing for a subsequent identification number using the testing step; and
    transmitting the subsequent identification number to the administrative entity for verification.

5. A method, comprising:
    setting a supply voltage of a static random access memory (SRAM) below its normal operating voltage;
    identifying at least some memory cells of the SRAM that fail a read and/or write test;
    using addresses of at least some of an identified memory cells of the SRAM at least as a basis of the identification number; and
    storing the identification number in memory for subsequent retrieval.

6. The method of claim 5, further comprising:
    repeating the setting steps at at least one lower or higher level of the supply voltage to identifying at least some further memory cells of the SRAM that fail a read and/or write test; and
    using addresses of at least some of the further identified memory cells of the SRAM as at least part of the identification number.

7. The method of claim 5, further comprising processing the addresses of at least some of the memory cells of the SRAM to form the identification number.

8. A method, comprising:
    testing a static random access memory (SRAM) by at least one of: (i) identifying at least some memory cells of the SRAM that have an access speed margin at least one of lower than a predetermined threshold and higher than a predetermined threshold or identifying at least some memory cells of the SRAM that have an access time at least one of higher than a predetermined threshold and lower than a predetermined threshold, and (ii) setting a supply voltage to the SRAM to its normal operating voltage and identifying at least some memory cells of the SRAM that fail a read and/or write test;
    repairing at least some of the memory cells resulting in failure of the testing step;
    using repair addresses of at least some of the repaired memory cells of the SRAM at least as a basis of an identification number; and
    storing the identification number in memory for subsequent retrieval.

9. The method of claim 8, further comprising processing the addresses of at least some of the memory cells of the SRAM to form the identification number.

10. A method, comprising:
    testing a static random access memory (SRAM) to obtain performance data on the SRAM;
    using the performance data of the SRAM as at least a basis of a identification number;
    storing the identification number in memory for subsequent retrieval;
    producing a sum of products on at least some digits of the identification number and a subsequent identification number; and
    verifying the subsequent identification number when the sum of products exceeds a predetermined threshold.

11. The method of claim 10, further comprising:
    storing the identification number with an administrative entity;
    re-testing for a subsequent identification number using the testing step; and
    transmitting the subsequent identification number to the administrative entity for verification.

12. An apparatus, comprising:
    a static random access memory (SRAM); and
    an interrogation circuit operable to: (i) obtain performance data on the SRAM, (ii) identify at least some memory cells of the SRAM that have an access speed margin at least one of lower than a predetermined threshold and higher than a predetermined threshold in order to obtain the performance data or identify at least some memory cells of the SRAM that have an access time at least one of higher than a predetermined threshold and lower than a predetermined threshold in order to obtain the performance data, and (iii) use addresses of at least some of the memory cells of the SRAM at least as a basis of an identification number.

13. The apparatus of claim 12, wherein the identification number is substantially unique and substantially repeatable.

14. The apparatus of claim 12, wherein the interrogation circuit is further operable to:
- power up the SRAM;
- interrogate a statistically large number of memory cells of the SRAM;
- use contents of at least some of the memory cells as at least the basis of the identification number.

15. An apparatus, comprising:
- a static random access memory (SRAM); and
- an interrogation circuit operable to set a supply voltage to the SRAM below its normal operating voltage; identify at least some memory cells of the SRAM that fail a read and/or write test in order to produce the performance data; and use addresses of at least some of the memory cells of the SRAM at least as a basis of an identification number.

16. The apparatus of claim 15, wherein the interrogation circuit is further operable to:
- repeat setting and identifying functions at at least one lower or higher level of the supply voltage to obtain further performance data; and
- use addresses of at least some further identified memory cells of the SRAM as at least part of the identification number.

17. An apparatus, comprising:
- a static random access memory (SRAM); and
- an interrogation circuit operable to use repair addresses as at least a basis of an identification number, the repair addresses being obtained by at least one of: (i) identifying at least some memory cells of the SRAM that have an access speed margin lower than a predetermined threshold or identifying at least some memory cells of the SRAM that have an access time greater than a predetermined threshold; (ii) setting a supply voltage to the SRAM to its normal operating voltage and identifying at least some memory cells of the SRAM that fail a read and/or write test; and (iii) repairing at least some of the memory cells resulting in failure.

\* \* \* \* \*